(12) United States Patent
Shen

(10) Patent No.: US 9,425,125 B2
(45) Date of Patent: Aug. 23, 2016

(54) SILICON-GLASS HYBRID INTERPOSER CIRCUITRY

(71) Applicant: Altera Corporation, San Jose, CA (US)

(72) Inventor: Minghao Shen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/185,631

(22) Filed: Feb. 20, 2014

(65) Prior Publication Data
US 2015/0235921 A1 Aug. 20, 2015

(51) Int. Cl.
| H01L 23/48 | (2006.01) |
| H01L 23/14 | (2006.01) |
| H01L 23/15 | (2006.01) |
| H01L 21/48 | (2006.01) |
| H01L 25/065 | (2006.01) |
| H01L 23/538 | (2006.01) |
| H01L 23/498 | (2006.01) |
| H01L 23/00 | (2006.01) |

(52) U.S. Cl.
CPC ............ H01L 23/481 (2013.01); H01L 21/486 (2013.01); H01L 23/147 (2013.01); H01L 23/15 (2013.01); H01L 23/5384 (2013.01); H01L 23/5385 (2013.01); H01L 25/065 (2013.01); *H01L 23/49816* (2013.01); *H01L 24/16* (2013.01); *H01L 2224/16225* (2013.01); *H01L 2924/15311* (2013.01)

(58) Field of Classification Search
CPC .. H01L 23/481; H01L 23/49811; H01L 24/11
See application file for complete search history.

(56) References Cited

U.S. PATENT DOCUMENTS

| 8,269,326 | B2 | 9/2012 | Lee | |
| 8,411,459 | B2 | 4/2013 | Yu et al. | |
| 8,575,758 | B2 * | 11/2013 | West | H01L 21/78 257/686 |
| 8,637,995 | B2 * | 1/2014 | Sadaka | 257/774 |
| 2013/0037922 | A1 * | 2/2013 | Arriagada et al. | 257/652 |
| 2013/0070437 | A1 | 3/2013 | Mohammed et al. | |
| 2013/0336624 | A1 | 12/2013 | Bowen | |
| 2014/0073087 | A1 * | 3/2014 | Huang et al. | 438/107 |
| 2014/0145326 | A1 * | 5/2014 | Lin et al. | 257/737 |
| 2014/0252603 | A1 * | 9/2014 | Lee | H01L 23/481 257/737 |

FOREIGN PATENT DOCUMENTS

| EP | 2455329 | 5/2012 |
| WO | 0211206 | 2/2002 |
| WO | 2013025338 | 2/2013 |

* cited by examiner

*Primary Examiner* — William Coleman

(57) ABSTRACT

An interposer is provided. The interposer includes a silicon substrate layer, a glass substrate layer, and at least one through interposer via. The silicon substrate layer is formed on top of the glass substrate layer. The interposer may also be known as a hybrid interposer because it includes two different types of substrate layers forming one interposer. The through interposer via is formed to go through the silicon substrate layer and the glass substrate layer. The interposer may be used for forming an integrated circuit package. The integrated circuit package includes multiple integrated circuits that are mounted on the interposer.

20 Claims, 7 Drawing Sheets

SILICON-GLASS HYBRID INTERPOSER CIRCUITRY

BACKGROUND

Integrated circuit devices with multiple stacked integrated circuits often include an interposer as a medium to couple the different integrated circuits together. The interposer is generally placed between the integrated circuits and a package substrate. The interposer may have signal pathways that can be used for transmitting data between two or more integrated circuits mounted on the interposer, or between one of the integrated circuits on the interposer and components mounted directly on the package substrate.

Interposers are typically formed from silicon substrates. However, interposers formed from silicon wafers may be brittle. Hence, complex manufacturing processes may be required to produce such interposers. Active and passive devices may be embedded in the silicon interposers. However, they usually have poor signal transmission characteristics (e.g., poor insertion loss and poor return loss). Therefore, silicon interposers may be unsuitable for high frequency applications.

Another type of wafer that may be used to form interposers is a glass wafer (or a non-semiconductor wafer). A glass interposer does not include any silicon substrate material and may exhibit better signal transmission characteristics compared to a silicon interposer. However, active circuits (i.e., transistor) cannot be embedded in a glass interposer.

SUMMARY

Embodiments described herein include a hybrid interposer and a method of manufacturing the hybrid interposer. It should be appreciated that the embodiments can be implemented in numerous ways, such as a process, an apparatus, a system, a device, or a method. Several embodiments are described below.

In one embodiment, an interposer is described. The interposer includes a silicon substrate layer, a glass substrate layer, and at least one through interposer via. The silicon substrate layer is formed on top of the glass substrate layer. The interposer may also be known as a hybrid interposer because it includes two different types of substrate layers forming one interposer. The through interposer via is formed to go through the silicon substrate layer and the glass substrate layer.

In another embodiment, the interposer described in the above embodiment may be used for forming an integrated circuit package. The integrated circuit package includes multiple integrated circuits that are mounted on the interposer.

In addition to that, a method of manufacturing a hybrid interposer having a glass wafer is described. The method includes a step to form a silicon wafer on the glass wafer. Next, the method includes a step to form a plurality of microbumps for the hybrid interposer. Finally, the method includes a step to form a plurality of flip-chip bumps for the hybrid interposer.

Further features of the invention, its nature and various advantages will be more apparent from the accompanying drawings and the following detailed description of the preferred embodiments.

DETAILED DESCRIPTION

The following embodiments describe a hybrid interposer and a method to manufacture the hybrid interposer. It will be obvious, however, to one skilled in the art, that the present exemplary embodiments may be practiced without some or all of these specific details. In other instances, well-known operations have not been described in detail in order not to unnecessarily obscure the present embodiments.

Figure 1:
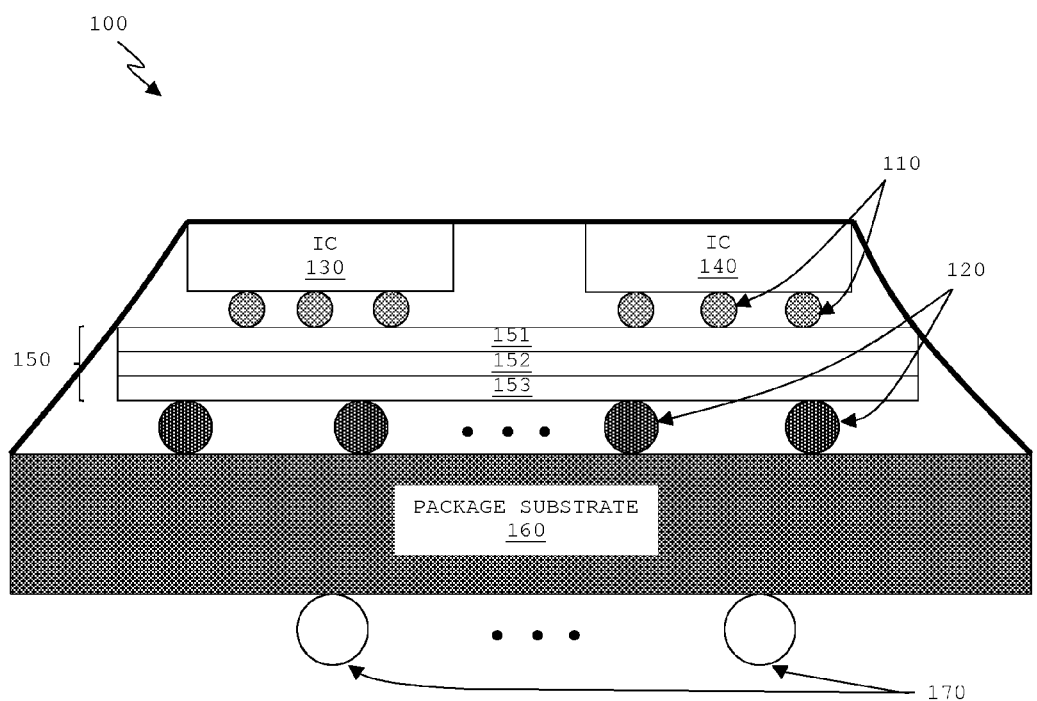
FIG. 1 shows an illustrative diagram of an integrated circuit package in accordance with one embodiment of the present invention.

FIG. 1, meant to be illustrative and not limiting, illustrates an integrated circuit package in accordance with one embodiment of the present invention. Integrated circuit package 100 includes integrated circuits 130 and 140, interposer 150 and package substrate 160. Integrated circuit package 100 further includes solder balls 170 on a bottom surface of package substrate 160.

Integrated circuit package 100 may be placed on a printed circuit board (PCB). Each solder ball 170 on integrated circuit package 100 may be coupled to a solder pad on the PCB (not shown). In one embodiment, integrated circuit package 100 may transmit signals to a device mounted on the PCB through signal pathways that are coupled to solder balls 170.

Integrated circuit package 100 may form a part of a wireless system, a wired system, or other types of systems. Hence, integrated circuit package 100 may include circuits that perform various functions that define the system.

In one embodiment, integrated circuit package 100 may be an application specific integrated circuit (ASIC) device or an application specific standard product (ASSP) device, such as, a memory controller device. The memory controller device may be utilized for controlling data transfer between a memory device and other devices, for example, a microprocessor device. In order to support the data transfer, integrated circuit package 100 may include circuits that handle different protocol standards.

Alternatively, integrated circuit package 100 may be a programmable logic device (PLD), for example, a field programmable gate array (FPGA) device. It should be noted that a PLD may be configured to implement different user designs or applications. In one exemplary embodiment, the PLD may be configured as a memory controller. In another exemplary embodiment, the PLD may be configured as an arithmetic logic unit (ALU).

Integrated circuit package 100 may also be a multi-chip package or system-on-package (SoP) device with more than one integrated circuit within integrated circuit package 100. Even though two integrated circuits 130 and 140 are shown in FIG. 1, it should be appreciated that there may be more than two integrated circuits in a multi-chip package such as integrated circuit package 100.

Referring still to FIG. 1, integrated circuits 130 and 140 may perform the core functions of integrated circuit package 100. In one embodiment, integrated circuits 130 and 140 may include active circuits (e.g., transistor circuits). The active circuits within integrated circuits 130 and 140 may include memory elements, programmable logic elements or arithmetic logic units that perform a variety of functions.

In one embodiment, integrated circuits 130 and 140 may be different types of devices, for example, an FPGA die and a memory die, respectively. Alternatively, integrated circuit 130 and 140 may be similar types of devices, for example, FPGA dies. It should be appreciated that combining different types of integrated circuits 130 and 140 may yield different functions for integrated circuit package 100.

Referring still to FIG. 1, integrated circuits 130 and 140 may be mounted on interposer 150 via micro-bumps (μ-bumps) 110. Interposer 150 may be coupled to a top surface of package substrate 160 via bumps 120. In one embodiment, bumps 120 may be C4 bumps, micro-bumps (μ-bumps) or flip-chip bumps. The diameter of bumps 120 may be larger than the diameter of μ-bumps 110. Interposer 150 may include signal pathways (not shown) that enable integrated circuits 130 and 140 to communicate with each another. In one embodiment, a signal transmitted from integrated circuit 130 may propagate from μ-bump 110 on integrated circuit 130 to a corresponding μ-bump 110 on integrated circuit 140 using one of the signal pathways on interposer 150.

As described above, integrated circuits 130 and 140 are attached to interposer 150 instead of being directly attached to package substrate 160 because of the finer width signal pathways (not shown) achievable on interposer 150 compared to package substrate 160. It should be noted that interposer 150 may have finer width (e.g. 3-5 microns (μm)) signal pathways because manufacturing processes that are available for interposer 150 are generally more advanced than manufacturing processes that are available for package substrate 160. Furthermore, the fine width for signal pathways may also be achieved because the dielectric constant of interposer 150 may be greater than the dielectric constant of package substrate 160. A person skilled in the art appreciates that the width of signal pathways may be inversely proportional to the value of dielectric constant for a particular characteristic impedance. Therefore, a higher dielectric constant for interposer 150 may allow manufacturing of finer signal pathways (for particular characteristic impedance).

Referring still to FIG. 1, interposer 150 may be a hybrid interposer. In one embodiment, the hybrid interposer may include inter-metal dielectric (IMD) layer 151, silicon layer 152 and glass layer 153. IMD layer 151 may be utilized to route signals from μ-bump 110 on either one of integrated circuits 130 and 140 to a bump 120 on interposer 150. In one embodiment, active circuits (e.g., transistor circuits) may be embedded in silicon layer 152 of interposer 150. Glass layer 153 may be a base layer in interposer 150. In one embodiment, the glass layer may increase signal transmission characteristics (i.e., better insertion loss and return loss) of interposer 150.

FIGS. 2A-2I, meant to be illustrative and not limiting, illustrate a hybrid interposer 280 at different manufacturing stages in accordance with one embodiment of the present invention. Various semiconductor manufacturing processes may be used for manufacturing hybrid interposer 280.

Figure 2A:
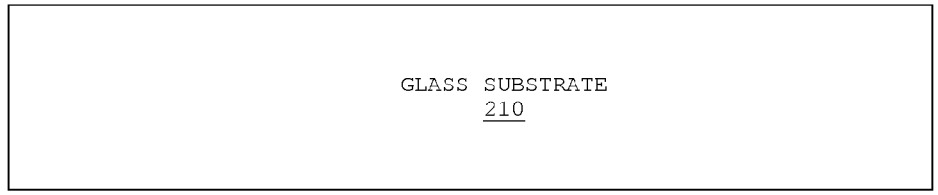
FIGS. 2A-2I are illustrative diagrams of a hybrid interposer at different manufacturing stages in accordance with embodiments of the present invention.

FIG. 2A shows a glass substrate. Glass substrate 210 may be a glass layer in hybrid interposer. In one embodiment, glass substrate 210 may be similar to glass layer 153 of FIG. 1. Glass substrate 210 may be formed using a glass wafer. In the embodiment of FIG. 2A, glass substrate 210 forms the base of the hybrid interposer 280.

In one embodiment, glass substrate 210 may be a sodium-containing Borofloat or Pyrex® glass. It should be appreciated that there many other types of glass substrate that are available which may be used as glass substrate 210. Glass substrate 210 may have better chemical durability, thermal stability, and optical properties than silicon substrates. However, glass substrate 210 and silicon substrate generally have similar structural stability. Glass substrate 210 may also have better signal transmission properties than silicon substrates.

Figure 2B:
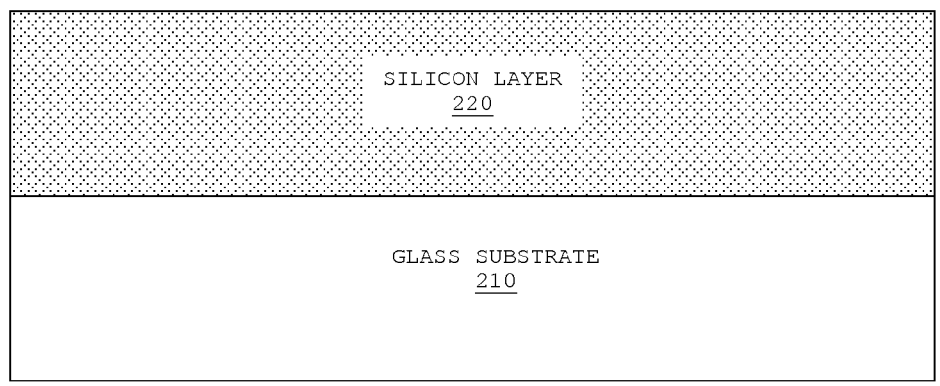

FIG. 2B shows silicon layer 220 bonded to an upper surface of glass substrate 210. In one embodiment, passive or active circuits may be embedded in silicon layer 220 through a standard silicon processing steps discussed in more detail through FIG. 2E. In one embodiment, silicon layer 220 may be formed on glass substrate 210 using an anodic process. It should be appreciated that the anodic process includes heating both substrates (i.e., glass substrate 210 and a silicon substrate) to a high temperature before supplying an electrostatic field through both substrates. These steps will form silicon layer 220 on the top surface of glass wafer 210.

Alternatively, silicon layer 220 may be bonded to the top surface of glass substrate 210 using a direct oxide bonding process. The direct oxide bonding process may be similar to the Ziptronix™ Zibond™ bonding process. It should be appreciated that other direct oxide bonding processes may also exist to bond silicon layer 220 onto glass substrate 210.

Referring still to FIG. 2B, silicon layer 220 and glass substrate 210 may have equal thicknesses. In one embodiment, silicon layer 220 and glass substrate 210 may each have a thickness value of 200-300 μm.

Figure 2C:
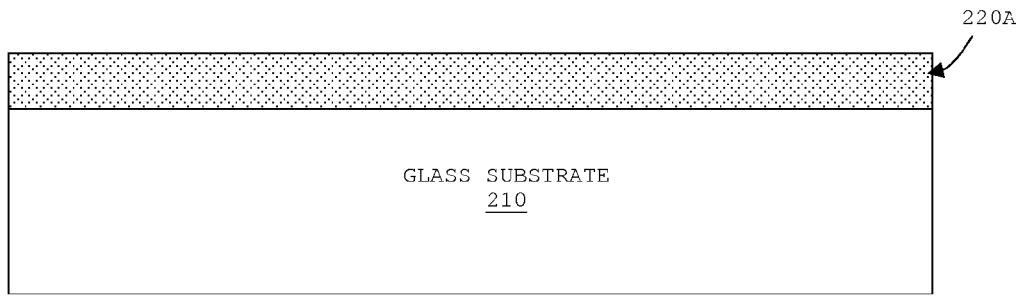

FIG. 2C shows a partially formed hybrid interposer that has silicon layer 220A. Silicon layer 220A may have a thickness of 10-20 μm. Silicon layer 220A may begin as a silicon layer similar to silicon layer 220 as shown in FIG. 2B, and may be formed via a substrate thinning process. It should be appreciated that the substrate thinning process may include backgrinding, chemical-mechanical polishing (CMP) processes or any other process capable of reducing the silicon layer thickness. In one embodiment, backgrinding process grinds the top surface of silicon layer 220 (as shown in FIG. 2B) to the desired thickness. It should be appreciated that the CMP process, subsequently, may even out irregular topography on the top surface of silicon layer 220A. It should be appreciated that a smooth surface may allow active circuits to be formed on silicon layer 220A. The purpose for thinning a substrate layer may be to manufacture a lower-profile interposer. A low-profile interposer may be required to manufacture a low-profile integrated circuit package. Furthermore, a low-profile interposer may have better signal integrity, especially when signals are transmitted via a through interposer via (TIV). This is because the signal transmission pathway through a low-profile interposer is shorter than that of a high-profile interposer.

Figure 2D:
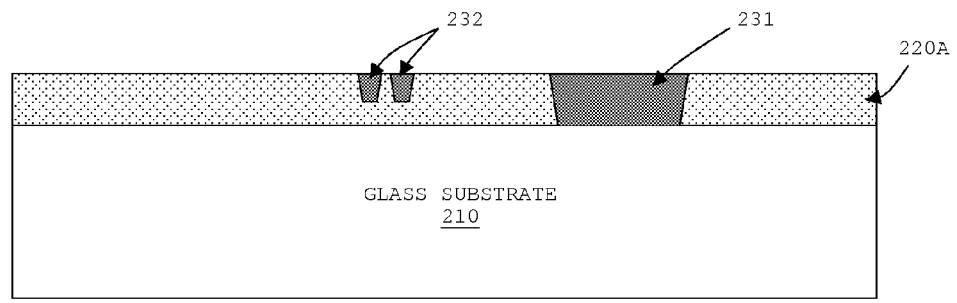

FIG. 2D shows a partially formed hybrid interposer with two structures formed on silicon layer 220A. In one embodiment, the structures include shallow trench isolation (STI) 232 and insulation liner 231. STI 232 and insulation liner 231 may be formed during a semiconductor manufacturing process that is commonly used for silicon wafers (e.g., photolithography, etching, deposition and CMP processes). In one embodiment, STI 232 and insulation liner 231 may include a dielectric material, such as, silicon dioxide ($SiO_2$).

STI 232 may be formed on silicon layer 220A to prevent electrical current leakage. For example, STI 232 may prevent electrical current leakage between two circuits formed on two different sides of STI 232 on the surface of silicon layer 220A.

Insulation liner 231 may be utilized to separate a conductive portion of a TIV (e.g., TIV 250A of FIG. 2G) from edges of silicon layer 220A that surround the conductive portion of the TIV. As shown in FIG. 2D, insulation liner 231 may form a trench that is deeper than STI 232. In one embodiment, the height of insulation liner 231 may be equal to the thickness of silicon layer 220A (e.g., 10-20 μm).

Figure 2E:
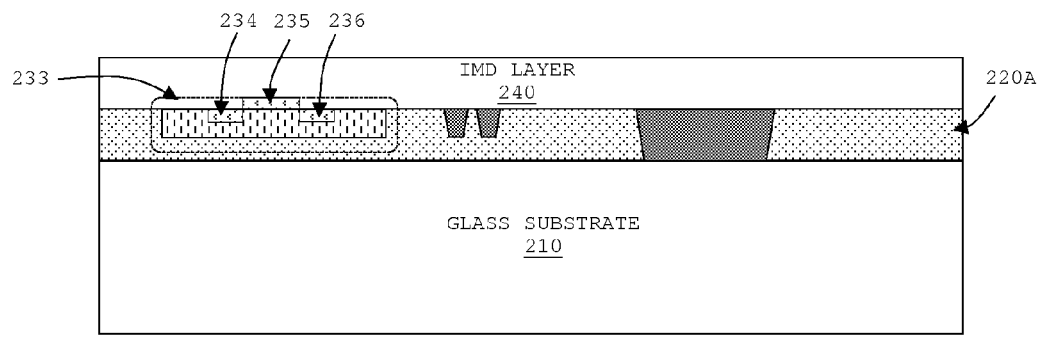

FIG. 2E shows an active circuit (e.g., transistor 233) and inter-metal dielectric (IMD) layer 240 formed on the top surface of silicon layer 220A. It should be appreciated that the active circuits (e.g., transistor 233) may be easily formed on the top surface of silicon layer 220A using a standard and well known silicon processing steps compared to forming on glass substrate 210. It should be appreciated that forming transistor 233 on the top surface of silicon layer 220A may be optional depending on circuit designs. Transistor 233 may include source region 234 and drain region 236 formed on silicon layer 220A, and gate 235 that is formed directly above the top surface of silicon layer 220A. Active circuits on top surface of silicon layer 220 may be utilized as switches for routing signals from integrated circuit (e.g., integrated circuit 130 of FIG. 1) to another integrated circuit (e.g., integrated circuit 140 of FIG. 1).

IMD layer 240 may be utilized to route signals to transistor 233 (or any other circuits that may be formed in silicon layer 220A). IMD layer 240 may be composed of a dielectric material, for example, silicon nitride (SiN) or silicon carbide (SiC). IMD layer 240 may also include passive circuits (not shown), for example, capacitors or inductors, in one embodiment. In one embodiment, IMD layer 240 may include multiple routing layers (not shown in FIG. 2E). A complex interposer design may have an IMD layer that includes at least three to four routing layers.

Figure 2F:
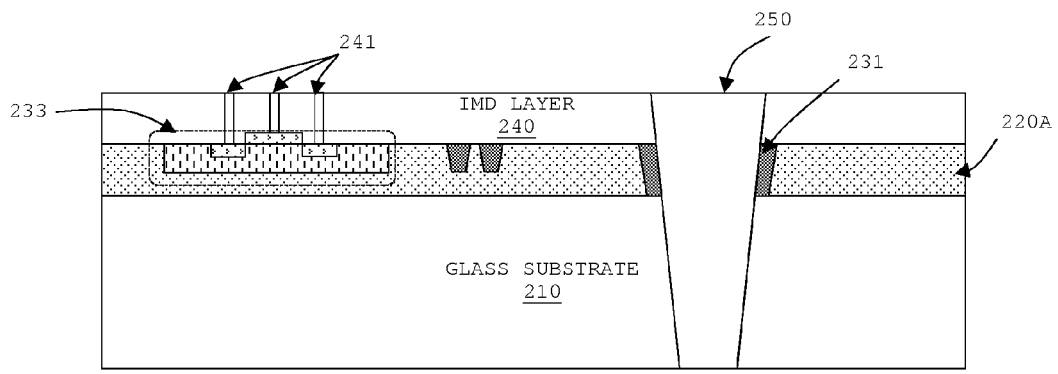

FIG. 2F shows a partially formed interposer that includes holes 241 to form interconnects that are coupled to gate 235, source 234 and drain 236 of transistor 233 and hole 250 to form a TIV. In FIG. 2F, holes 241 extend from the top surface of IMD layer 240 to the respective gate, source and drain terminals of transistor 233.

Figure 2G:
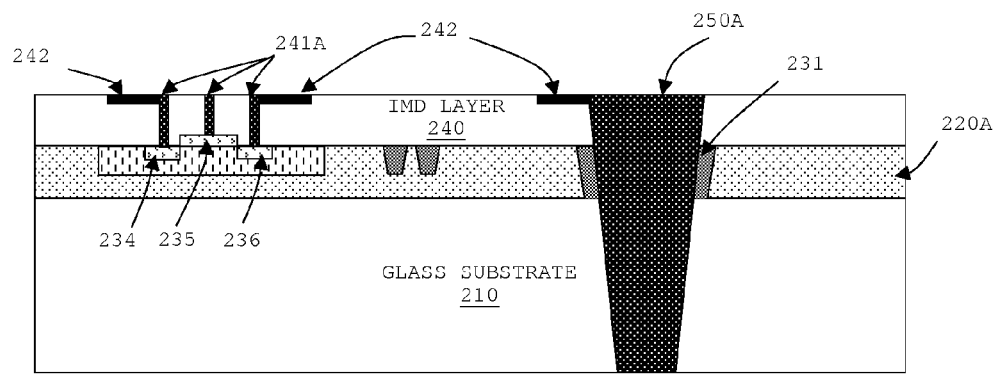

Hole 250 may be drilled for the purpose of forming TIV 250A of FIG. 2G. Hole 250 extends from the top surface of IMD layer 240 to the bottom surface of glass wafer 210. In FIG. 2F, hole 250 extends through the insulation liner 231. The diameter of hole 250 may be smaller than the diameter of insulation liner 231.

FIG. 2G shows a partially formed hybrid interposer having conductive through-hole vias 241A and TIV 250A. Holes 241 and hole 250 of FIG. 2F may be filled with conductive materials (e.g., copper) to form respective through-hole vias 241A and TIV 250A. It should be appreciated that any other conductive material may be used to form through-hole vias 241A and TIV 250A. TIV 250A may extend through IMD layer 240, silicon wafer layer 220A and glass wafer 210. TIV 250A may be isolated from silicon wafer 220A by insulating liner 231. Signals transmitted through TIV 250A may have better insertion loss and return loss compared to signals that are transmitted through a through silicon via (TSV) (i.e., a signal transmitting via that goes through a silicon-only substrate). The comparison of insertion loss performances between a TIV, such as TIV 250A, and a TSV is shown in insertion loss-frequency performance chart of FIG. 4.

Referring still to FIG. 2G, the process to form TIV 250A may include a deposition process to deposit a conductive material into hole 250 of FIG. 2F. However, the deposition process may deposit unwanted conductive material on the top surface of IMD layer 240. To remove the unwanted conductive material, a negative photoresist material may be deposited on the surface of IMD layer 240. Then, a photolithography process is performed with a photomask that has an opening aligned with the filled hole 250 of FIG. 2F. Next, the unexposed photoresist is removed. After that, an etching process is performed. The etching process removes the conductive layer on the surface of IMD layer 240 wherever the photoresist material was removed. Finally, the top surface of IMD layer 240 and the bottom surface of glass layer 210 may be polished using a CMP process to even out both of the surfaces.

Referring still to FIG. 2G, interposer 280 may also include signal pathways 242. In one embodiment, signal pathways 242 may be metal traces. Signal pathways 242 may be located on the surface of IMD layer 240. Signal pathways 242 may be coupled to the respective through-hole vias 241A and TIV 250A. Signal pathways 242, together with through-hole vias 241A and TIV 250A, may be used for routing signals through interposer 280.

Figure 2H:
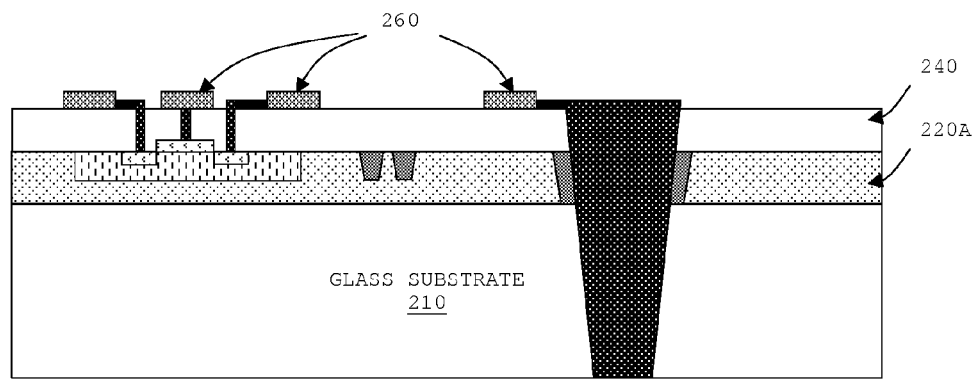

FIG. 2H shows a partially formed hybrid interposer having bump pads 260 that are formed on the top surface of IMD layer 240. Bump pads 260 may be coupled to μ-bumps on an integrated circuit die (e.g., integrated circuit 130 or integrated circuit 140 of FIG. 1). Bump pads 260 may be formed by semiconductor processes, which may include steps such photolithography, etching, depositing and polishing.

Figure 2I:
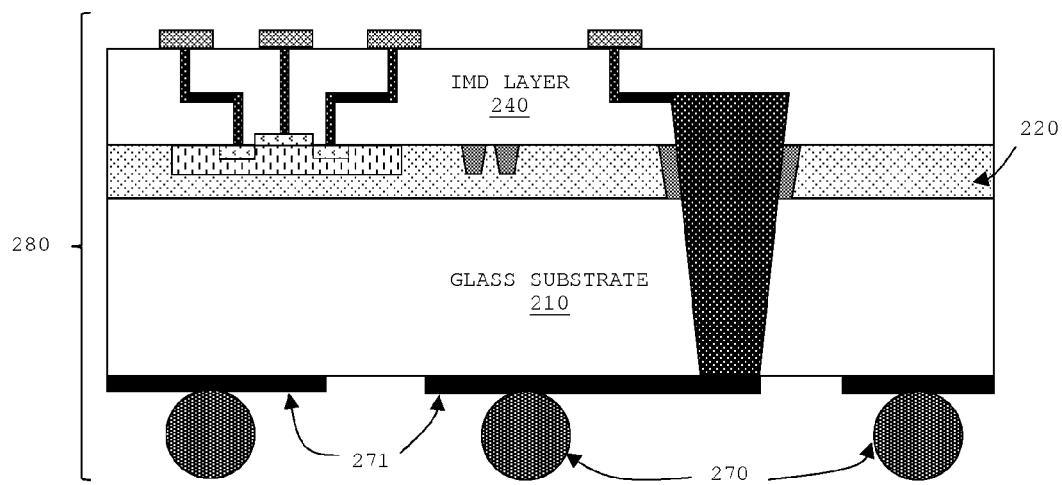

FIG. 2I shows interposer 280 having under bump metallization (UBM) 271 and μ-bumps 270 on the bottom surface of glass wafer 210. UBM 271 may be utilized to route signals from TIV 250A to μ-bumps 270. UBM 271 may also be utilized to provide a ground voltage level that surrounds a signal transmitting μ-bump 270. As an example, the middle μ-bump 270 shown in FIG. 2I may transmit signals to TIV 250A (or receive signals from TIV 250A). The right and left μ-bumps 270 (as shown in FIG. 2I) may be coupled to ground a ground voltage level via their respective UBM 271 to form a ground shield that surrounds the middle μ-bump 270.

Figure 3:
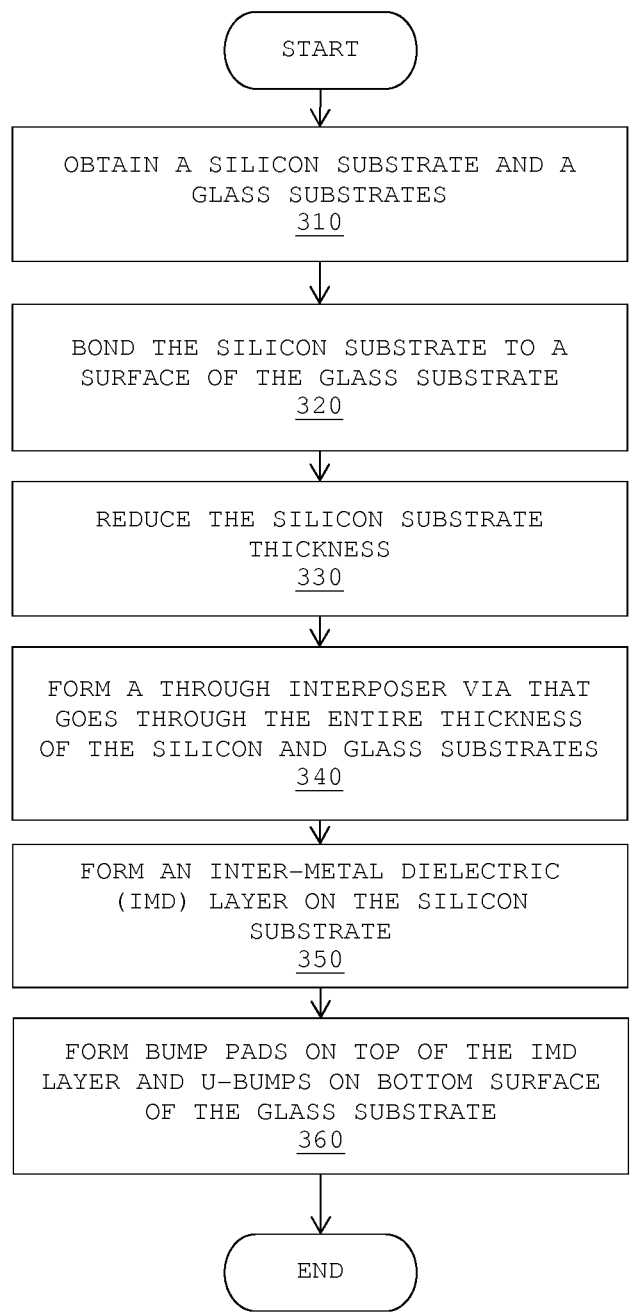
FIG. 3 shows a flowchart of an illustrative steps for manufacturing a hybrid interposer in accordance with one embodiment of the present invention.

FIG. 3, meant to be illustrative and not limiting, shows steps for manufacturing a hybrid interposer in accordance with one embodiment of the present invention. At step 310, silicon and glass substrates are obtained. The silicon and glass substrates may be similar to silicon layer 220 and glass layer 210, respectively, of FIGS. 2A-2I.

At step 320, a bottom surface of the silicon substrate is bonded to an upper surface of the glass substrate. Anodic bonding or direct oxide bonding may be used to bond the two substrates and the bonded substrates may be similar to the structure shown in FIG. 2B. At step 330, the thickness of the silicon substrate may be reduced via a thinning process. The silicon substrate may be similar to that shown in FIG. 2C after the thinning process. It should be noted that the thinning process may include a backgrinding process and a CMP process.

At step 340, a through interposer via (TIV) that extends from an upper surface of silicon substrate to bottom surface of the glass substrate may be formed. The TIV may be similar to TIV 250A of FIG. 2G. Optionally, active circuits may also be formed on the upper surface of silicon substrate. In one exemplary embodiment, the active circuits may be similar to transistor 233 of FIG. 2F.

At step 350, an inter-metal dielectric (IMD) layer may be formed above the top surface of the silicon substrate. The IMD layer may be similar to IMD layer 240 of FIGS. 2E-2H. Subsequently, at step 360, bump pads are formed on the top surface of the IMD layer and μ-bumps are formed on the bottom surface of the glass substrate. The bump pads may be similar to bump pads 260 of FIG. 2H and may be formed using the same method as described above with reference to FIG. 2H. Accordingly, the μ-bumps may be similar to μ-bumps 270 of FIG. 2I and may be manufactured using the same method as described above with reference to FIG. 2I. Upon completion of step 260, an interposer similar to interposer 280 of FIG. 2I may be formed.

Figure 4:
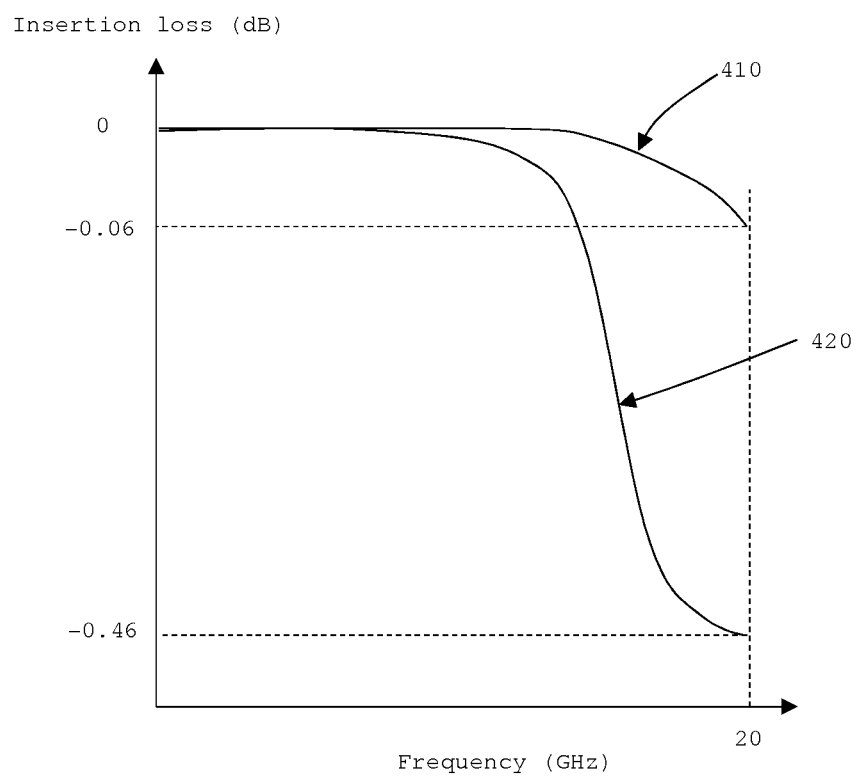
FIG. 4 shows an illustrative chart depicting an insertion loss performance for a signal that is transmitted through a through interposer via in a hybrid interposer in accordance with one embodiment of the present invention.

FIG. 4, meant to be illustrative and not limiting, illustrates exemplary insertion loss values for a signal that is transmitted across a through interposer via (TIV) in an interposer in accordance with one embodiment of the present invention and across a conventional through silicon via (TSV) in a silicon-only interposer. In one embodiment, the TIV may be similar to TIV 250A of FIG. 2G and may be used in a hybrid interposer similar to interposer 280 of FIG. 2I or interposer 150 of FIG. 1. The insertion loss (measured in decibel (dB)) of a signal may vary based on the frequency (measured in gigahertz (GHz)) of the signal.

Line 410 represents the insertion loss of a signal that is transmitted via a TIV while line 420 represents the insertion loss of a signal that is transmitted via a TSV. As shown in FIG. 4, at 20 GHz, the signal being transmitted via a TIV (represented by line 410) has an insertion loss of −0.06 dB whereas the signal being transmitted via a TSV (represented by line 420) has an insertion loss of −0.46 dB. Therefore, it should be noted that signals (especially higher frequency signals) transmitted via a TIV may have lower insertion loss compared to signals that are transmitted via a TSV.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An interposer, comprising:
   a semiconductor layer having first and second surfaces, wherein a plurality of interconnect routing layers is formed on the first surface of the semiconductor layer;
   a glass layer, wherein the semiconductor layer is interposed between the glass layer and the plurality of interconnect routing layers;
   a bump metallization conductor formed directly on the glass layer; and
   a bump formed directly on the bump metallization conductor.

2. The interposer as defined in claim 1, further comprising:
   an active circuit formed on the first surface of the semiconductor layer.

3. The interposer as defined in claim 1, wherein the semiconductor layer has a thickness less than that of the glass layer.

4. The interposer as defined in claim 1, further comprising:
   a through-interposer via formed through the semiconductor layer and the glass layer.

5. The interposer as defined in claim 2, wherein the active circuit comprises a transistor.

6. The interposer as defined in claim 4, wherein the through-interposer via is formed through a hole in the semiconductor layer, the interposer further comprising:
   an insulating layer that lines the hole and surrounds a portion of the through interposer via that runs through the hole.

7. The interposer as defined in claim 4, wherein the through interposer via comprising an insertion loss value that ranges between −0.06 decibel (dB) and −0.46 dB at a frequency of 20 Giga Hertz (GHz).

8. An integrated circuit package, comprising:
   an integrated circuit; and
   a hybrid interposer, wherein the integrated circuit is mounted on the hybrid interposer, and wherein the hybrid interposer comprises:
   a silicon substrate;
   a glass substrate that includes sodium, wherein the silicon substrate is formed directly on the glass substrate; and
   a plurality of bumps formed below the glass substrate.

9. The integrated circuit package as defined in claim 8, wherein the hybrid interposer further comprises:
   a through-interposer via formed through the silicon substrate and the glass substrate.

10. The integrated circuit package in claim 8, wherein the silicon substrate has a thickness less than that of the glass substrate.

11. The integrated circuit package in claim 8, further comprising:
    a plurality of microbumps interposed between the hybrid interposer and the integrated circuit.

12. The integrated circuit package as defined in claim 9, wherein the through-interposer via comprises:
    a conductive structure that runs entirely through the silicon substrate and the glass substrate; and
    an insulating liner that surrounds a portion of the conductive structure that runs through the silicon substrate.

13. The integrated circuit package as defined in claim 9, wherein the hybrid interposer further comprises:

a dielectric stack formed on the silicon substrate, wherein the dielectric stack includes interconnect routing paths that couple the integrated circuit to the through-interposer via.

14. A method of manufacturing a hybrid interposer having a glass wafer, comprising:
   forming a silicon wafer on the glass wafer;
   forming a plurality of microbumps for the hybrid interposer;
   forming a plurality of flip-chip bumps for the hybrid interposer; and
   forming a through-interposer via that is partly formed through the silicon wafer and partly formed through the glass wafer, wherein forming the through-interposer via further comprises:
      forming a first hole through only the silicon wafer.

15. The method as defined in claim 14, further comprising:
   forming a dielectric stack that includes interconnect routing paths on top of the silicon wafer.

16. The method as defined in claim 14, wherein forming the silicon wafer on the glass wafer further comprising:
   placing a surface of the silicon wafer on a surface of the glass wafer; and
   bonding the surfaces of the silicon wafer and the glass wafer.

17. The method as defined in claim 14, wherein the silicon wafer and the glass wafer have different thicknesses, the method further comprising:
   reducing the thickness of the silicon wafer so that the silicon wafer exhibits a reduced thickness that is less than the thickness of the glass wafer.

18. The method as defined in claim 14, further comprising:
   forming a transistor in the silicon wafer.

19. The method as defined in claim 14, further comprising:
   forming a passive circuit structure on the silicon wafer.

20. The method as defined in claim 14, wherein forming the through-interposer via further comprises:
   depositing dielectric material into the first hole;
   forming a second hole through the dielectric material and the glass wafer, wherein the second hole has a diameter smaller than that of the first hole; and
   depositing conductive materials into the second hole.

\* \* \* \* \*